United States Patent
Carinci et al.

(10) Patent No.: US 10,451,698 B2
(45) Date of Patent: Oct. 22, 2019

(54) METHOD AND APPARATUS FOR PARALLEL MAGNETIC RESONANCE DATA ACQUISITION

(71) Applicant: Siemens Healthcare GmbH, Erlangen (DE)

(72) Inventors: Flavio Carinci, Erlangen (DE); Wilhelm Horger, Schwaig (DE); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 195 days.

(21) Appl. No.: 15/585,344

(22) Filed: May 3, 2017

(65) Prior Publication Data

US 2017/0322280 A1    Nov. 9, 2017

(30) Foreign Application Priority Data

May 3, 2016    (DE) .......... 10 2016 207 641

(51) Int. Cl.
    *G01R 33/561*    (2006.01)
    *G01R 33/56*    (2006.01)

(52) U.S. Cl.
    CPC ..... *G01R 33/5617* (2013.01); *G01R 33/5608* (2013.01); *G01R 33/5611* (2013.01)

(58) Field of Classification Search
    CPC .......... G01R 33/4824; G01R 33/56509; G01R 33/5617; G01R 33/5608; G01R 33/5611
    See application file for complete search history.

(56) References Cited

U.S. PATENT DOCUMENTS

| | | | |
|---|---|---|---|
| 2008/0242972 A1 | 10/2008 | Jung et al. | |
| 2010/0237865 A1* | 9/2010 | Stemmer ............ | G01R 33/5611 324/309 |
| 2013/0170727 A1 | 7/2013 | Kawamura et al. | |
| 2013/0187651 A1 | 7/2013 | Konta et al. | |
| 2014/0197834 A1 | 7/2014 | Porter et al. | |
| 2015/0061673 A1* | 3/2015 | Li ...................... | G01R 33/4818 324/309 |

OTHER PUBLICATIONS

Jakob et al., "AUTO-SMASH: A self-calibrating technique for SMASH imaging," Magnetic Resonance Materials in Physics, Biology and Medicine, vol. 7 (1998), pp. 42-54.

* cited by examiner

*Primary Examiner* — Patrick Assouad
*Assistant Examiner* — Haidong Zhang
(74) *Attorney, Agent, or Firm* — Schiff Hardin LLP

(57) ABSTRACT

In a magnetic resonance (MR) apparatus and operating method, a first pulse sequence is executed in order to acquire echo signals from a target volume produced by radiation of a radio-frequency (RF) excitation pulse, thereby obtaining an original measurement dataset. A reference measurement dataset is then acquired by executing another pulse sequence immediately after acquisition of the aforementioned echo signals. These steps are repeated until the original measurement dataset has reached a predetermined degree of completeness that is still incomplete according to the Nyquist criterion. The original measurement dataset is then completed using the reference measurement dataset and a parallel acquisition technique.

9 Claims, 4 Drawing Sheets

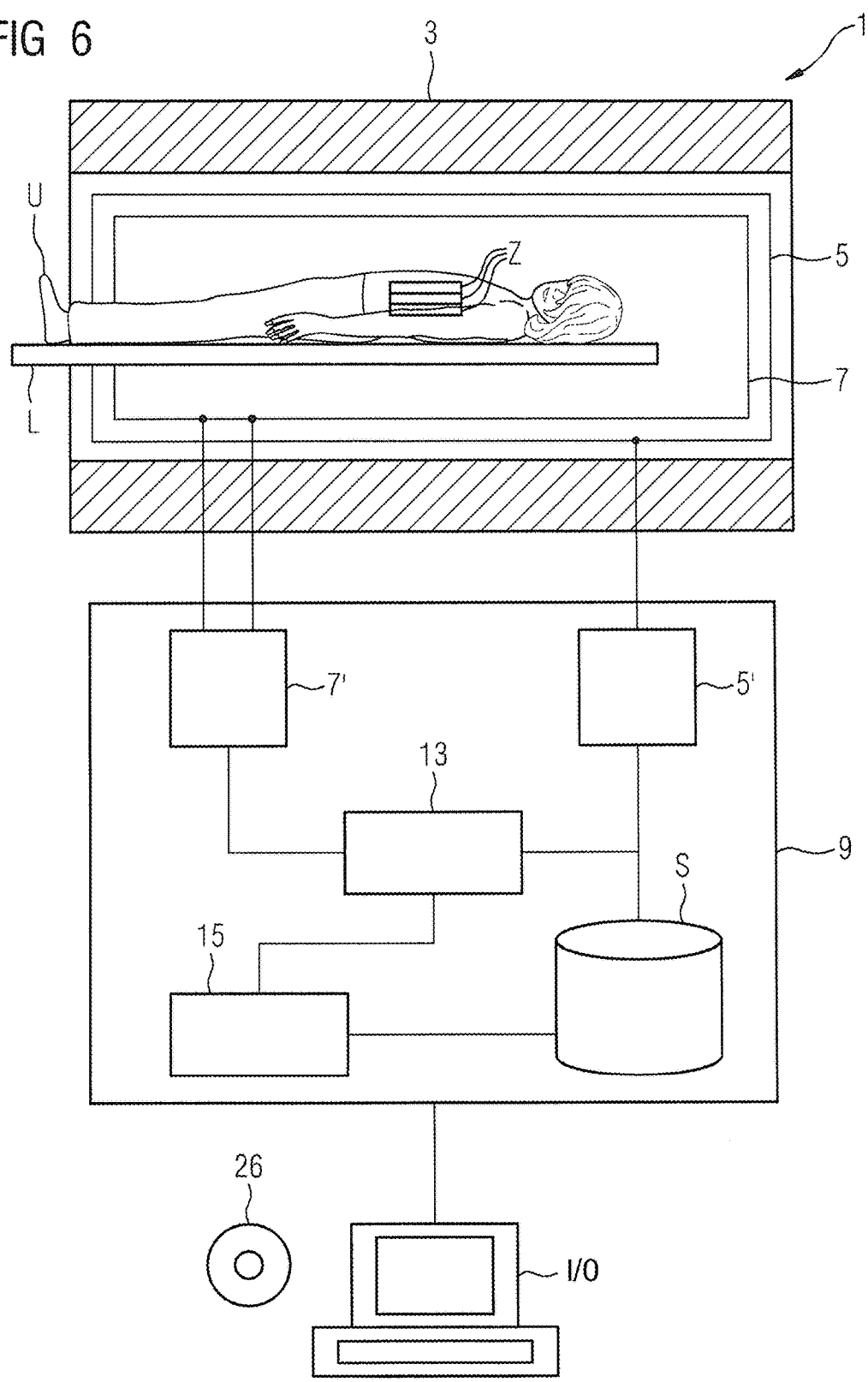

METHOD AND APPARATUS FOR PARALLEL MAGNETIC RESONANCE DATA ACQUISITION

BACKGROUND OF THE INVENTION

Field of the Invention

The invention concerns parallel magnetic resonance imaging, in particular a method, a magnetic resonance apparatus, and a non-transitory, electronically readable data storage medium for acquiring magnetic resonance data by execution of a parallel magnetic resonance technique.

Description of the Prior Art

Magnetic resonance (MR) technology is a well-known modality by which images of the interior of an examination subject can be generated. In simplified terms, the examination subject is positioned for this purpose in a magnetic resonance scanner in a strong, static, homogeneous basic magnetic field, also referred to as the $B_0$ field, at field strengths of 0.2 tesla up to 7 tesla and more, such that the nuclear spins thereof are aligned along the basic magnetic field. In order to trigger nuclear spin resonances, radio-frequency excitation pulses (RF pulses) are radiated into the examination subject, the triggered nuclear spin resonances are measured as echo signals that are stored in the form of so-called k-space data, and MR images are reconstructed (or spectroscopic data determined) on the basis thereof, e.g. by a multidimensional Fourier transform. Typically, rapidly switched magnetic gradient fields are superimposed on the basic magnetic field for the purpose of spatially encoding the measurement data.

There are essentially two ways of generating echo signals following an excitation of the nuclear spins. The excited nuclear spins can be manipulated by activating dephasing and rephasing gradients G1, G2 in such a way that the signal decays faster than is due to the T2*decay inherent in the measured tissue. After a certain time, the echo time TE, following the RF excitation pulse RF1, forms a gradient echo GRE that is to be measured, as shown schematically in FIG. 1. Sequences of this type are generally referred to as GRE sequences. Another technique is to generate a so-called spin echo SE by application of an RF refocusing pulse RF2 after the application of the RF excitation pulse RF1 after a time TE, again referred to as the echo time, following the RF excitation pulse RF1. This spin echo SE is measured and its amplitude is reduced in accordance with the T2 decay inherent in the measured tissue. This is shown schematically in FIG. 2. Sequences of this type are generally referred to as SE sequences. There are also sequences that generate both gradient echoes and spin echoes, e.g. (true) FISP sequences. In each case, the excitation and the measurement of the generated echo signals in each sequence are repeated as necessary (e.g. with switching of different gradients for spatial encoding purposes) until the desired number of echo signals has been measured and stored in k-space, in order to enable the examination subject to be imaged.

Among the SE sequences, in particular the TSE sequences (TSE: "Turbo Spin Echo"), which are also known by the names FSE ("Fast Spin Echo") or RARE ("Rapid Acquisition with Refocused Echoes") sequences, are widely established in clinical application. The advantage of the TSE sequences compared to the "simple" SE sequence is that after an RF excitation pulse RF1, a number of refocusing pulses RF2 are radiated, and as a consequence a number of spin echo signals SE are also generated. This results in faster data acquisition.

With so-called "single shot" methods, the totality of k-space data that are to be acquired in this case, e.g. in order to image a slice of interest of an examination subject, can be collected after just one RF excitation RF1.

An example of such a single-shot TSE sequence is the HASTE sequence ("Half-Fourier Acquisition Single-shot Turbo spin Echo imaging"), in which a "partial Fourier" method, in particular the half-Fourier method, is employed in addition in order to reduce the amount of k-space data that are to be collected. In this case, the symmetry of k-space with respect to complex conjugation is used in order to derive non-measured k-space data from the measured k-space data. This enables all of the k-space data that are required for a slice to be imaged to be acquired after just one excitation pulse RF1. HASTE sequences of this type are typically employed for the acquisition of MR images in the abdominal or thoracic region in order to enable areas as large as possible of the volume of interest in the examination subject to be acquired in a breath-hold phase, with accordingly reduced sensitivity to physiological movements.

FIG. 3 shows a schematic sequence diagram of such a HASTE sequence. As mentioned, a number of refocusing pulses RF2 are radiated after an excitation pulse RF1 in order to generate a number of spin echo signals (not shown), each of which is produced between the refocusing pulses RF2. In order to limit the excitation to spins of a specific slice, a corresponding slice selection gradient GS can be activated in this case simultaneously with each excitation pulse RF1 and refocusing pulse RF2. For further spatial encoding, frequency encoding gradients GF and phase encoding gradients GP can be activated. With HASTE, it is possible in this case to dispense with some (usually just under half) of the phase encoding gradients GP, as is indicated in FIG. 3 by the asymmetric arrangement of the phase encoding gradients GP. The corresponding "missing" spin echo signals can, as stated, be added by means of a partial Fourier method. The illustrated asymmetric arrangement of the phase encoding gradients GP, in which a greater number of echo signals are measured after the measurement of the echo signals in the center of k-space (GP=0) than before the measurement of the center of k-space, is advantageous in order that the echo times at which the central k-space area (low amplitudes of the phase encoding gradients GP) is measured are kept as short as possible. In this way, the echo signals of the central k-space area are less strongly attenuated in accordance with the T2 decay than in the case of a different arrangement that measures the central k-space area only at later echo times.

Also known in addition to the cited partial Fourier methods are techniques known as parallel acquisition techniques (e.g. GRAPPA and SENSE), with which acquisition times required for collecting the desired data can be shortened. As in the case of partial Fourier methods, in this case only parts of the echo signals that are actually to be acquired according to the Nyquist condition are measured as k-space data. In contrast to the partial Fourier methods, however, in the case of parallel acquisition techniques the non-measured parts are generally more uniformly distributed over k-space that is to be measured according to Nyquist, such that e.g. only every other k-space line is measured (filled with data). With parallel acquisition techniques, the "missing" k-space data are reconstructed with the use of coil sensitivity data. The coil sensitivity data are determined from reference measurement data, which sample (fill) at least an area of k-space that is to be measured, in most cases the central area, completely according to the Nyquist condition.

If reference measurement data of this type are acquired using a different sequence type than the measurement data that are to be completed for the actual measurement, this can lead to artifacts during the reconstruction of the measurement data, due to possibly different contrasts and/or different sensitivities to various sources of interference. The difference in time at which the reference measurement data are acquired compared to the actual measurement data, during which undesirable movements of the examination subject can occur, can also lead to artifacts during the reconstruction.

SUMMARY OF THE INVENTION

An object of the invention is to provide a method, a magnetic resonance apparatus, and a non-transitory, electronically readable data storage medium that avoid artifacts during the reconstruction of measurement data acquired by parallel acquisition techniques.

A method according to the invention for acquiring magnetic resonance data by means of a parallel acquisition technique includes the following steps:

a) radiating an RF excitation pulse of a first pulse sequence into a target volume of an examination subject, b) acquiring echo signals generated by the RF excitation pulse of the first pulse sequence and storing those signals in an original measurement dataset, c) acquiring a reference measurement dataset by execution of a second pulse sequence directly after the acquisition of the echo signals generated by the RF excitation pulse of the first pulse sequence, d) repeating steps a) to c) until the original measurement dataset has reached a desired completeness, yet is incomplete according to the Nyquist condition, e) completing the original measurement dataset with the use of the acquired reference measurement dataset and a parallel acquisition technique to produce a complete measurement dataset.

Because the reference measurement data are acquired directly after the acquisition of the actual (original) measurement data, i.e. due to the alternating acquisition of reference measurement data and original measurement data, there is no saturation of the magnetization in the acquired echo signals of the original measurement dataset. The quality of the obtained MR images can therefore be increased, since in this way regions having attenuated intensity are avoided. By acquiring the reference measurement data immediately after the acquisition of the original measurement data, there is therefore no need to accept any compromises in terms of the image contrast.

Furthermore, because the acquisition of the reference measurement data and the acquisition of the original measurement data are closely coupled in time, a high level of robustness of the method with regard to movements of the examination subject is achieved.

The present invention also encompasses a magnetic resonance apparatus having a magnetic resonance data acquisition scanner, with a basic field magnet, a gradient coil arrangement, a radio-frequency antenna, and a control computer, wherein the control computer is programmed in order to operate the magnetic resonance apparatus so as to implement the method as described above.

The present invention also encompasses a non-transitory, computer-readable data storage medium encoded with programming instructions that, when the data storage medium is loaded into a control computer of a magnetic resonance apparatus, cause the control computer to operate the magnetic resonance apparatus in order to implement the method as described above.

The advantages and explanations described in relation to the method also apply as well to the magnetic resonance apparatus and the electronically readable data medium.

BRIEF DESCRIPTION OF THE DRAWINGS

FIG. 6 schematically illustrates a magnetic resonance apparatus according to the invention.

DESCRIPTION OF THE PREFERRED EMBODIMENTS

Figure 1:
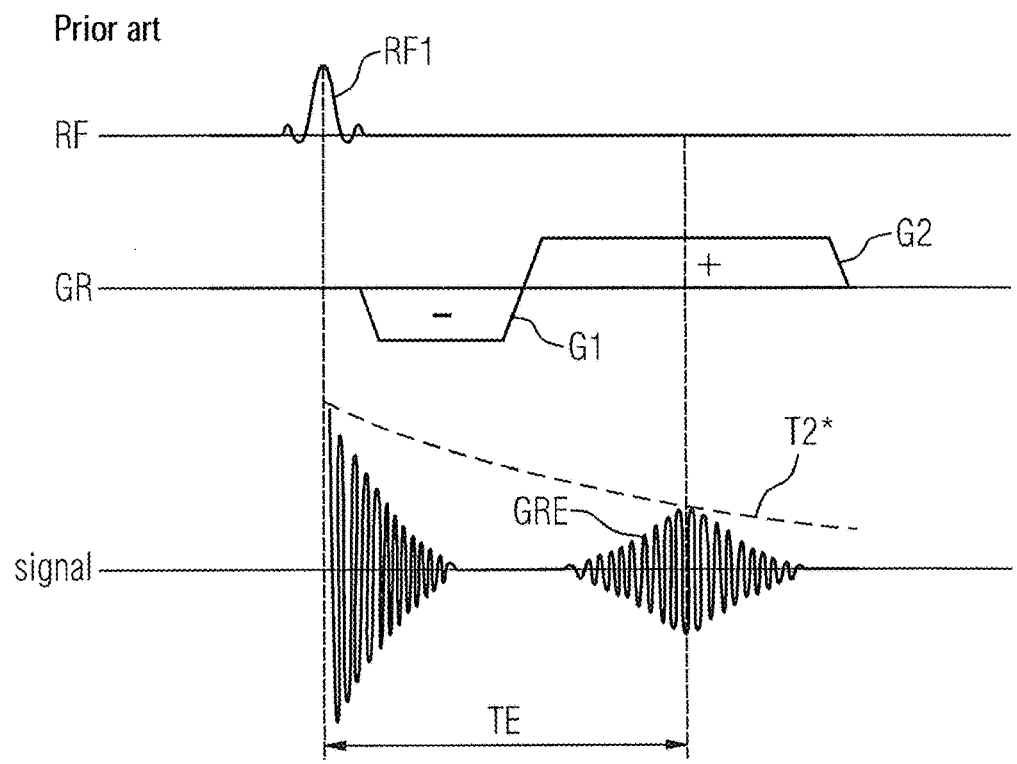
FIG. 1 shows a schematic representation of a gradient echo sequence.
Figure 2:
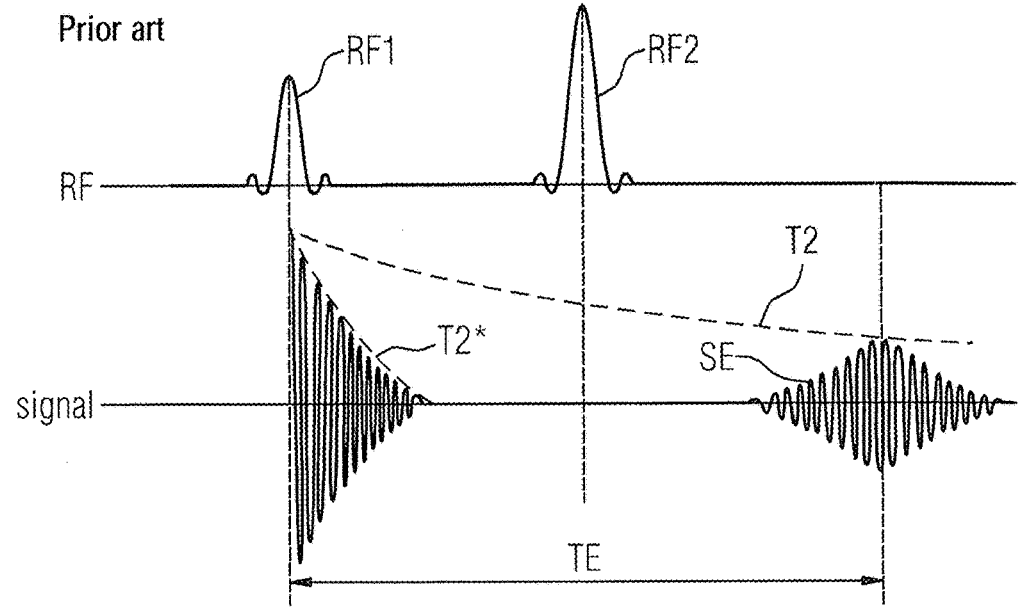
FIG. 2 shows a schematic representation of a spin echo sequence.
Figure 3:
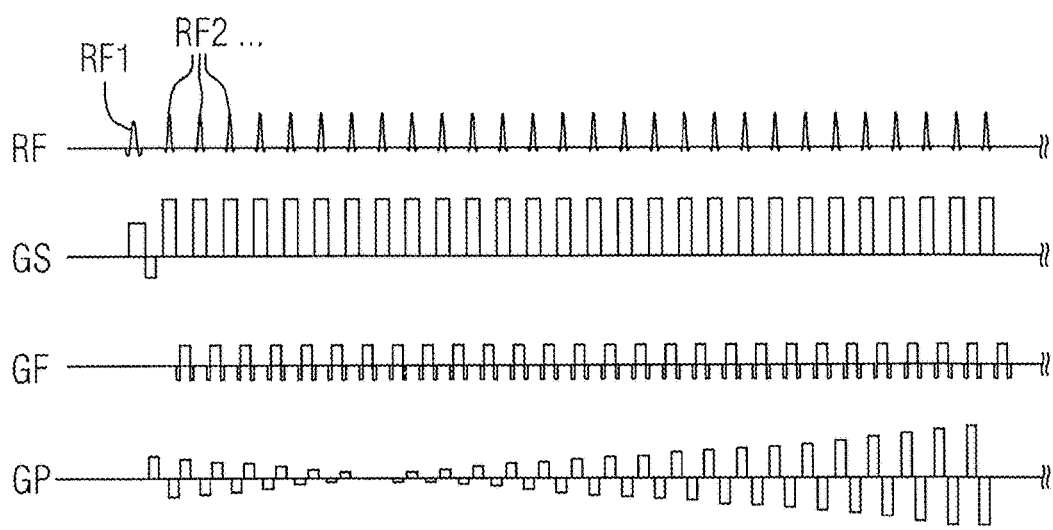
FIG. 3 shows a schematic representation of a HASTE sequence.
Figure 4:
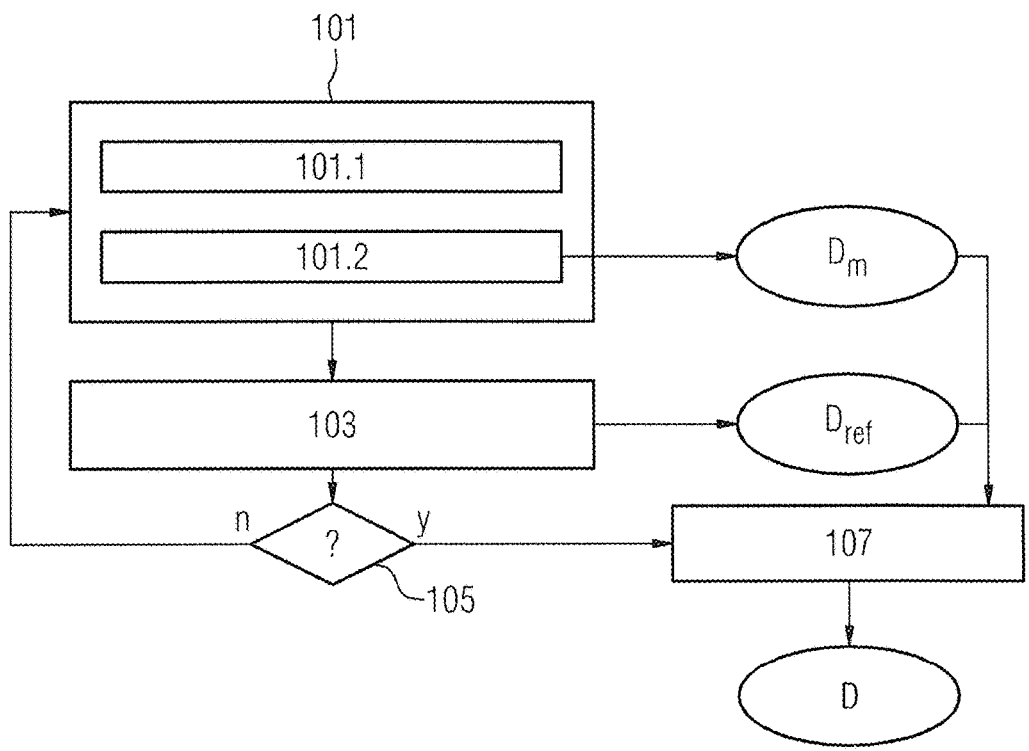
FIG. 4 is a flowchart of an embodiment of the method according to the invention.

FIG. 4 is a flowchart of an embodiment of the method according to the invention. First, in an original measurement data acquisition step 101, spin echoes are excited in a target volume Z of an examination subject U by means of an RF excitation pulse of a first pulse sequence PS1 (block 101.1). The excited spins are manipulated in a manner inherent to the first pulse sequence PS1 so that echo signals can be measured. The echo signals generated by the RF excitation pulse RF1 of the first pulse sequence PS1 are measured (block 101.2) and stored in an original measurement dataset $D_m$. After having been completed according to the invention by the use of a parallel acquisition technique, the thus-acquired measurement data of the original measurement dataset $D_m$ can be reconstructed into MR image data.

Directly after the thus completed acquisition of the echo signals generated by the RF excitation pulse RF1 of the first pulse sequence PS1, and before a possible further RF excitation pulse RF1 of the first pulse sequence PS1 is applied, a reference measurement dataset $D_{ref}$ is acquired by executing a second pulse sequence PS2 (block 103). This acquisition of the reference measurement dataset includes the RF excitation pulses provided for the second pulse sequence and acquisition of the generated echo signals. In this case, the central area of k-space that is to be sampled is filled with reference measurement data in the usual way until a reference measurement dataset is available that is sufficient for the parallel acquisition technique that is to be employed. It may be necessary in this case to wait until a certain, e.g. hardware-related, time delay has elapsed between the acquisition of the last echo signal of the first pulse sequence PS1 and the excitation pulse RF1 of the second pulse sequence.

Figure 5:
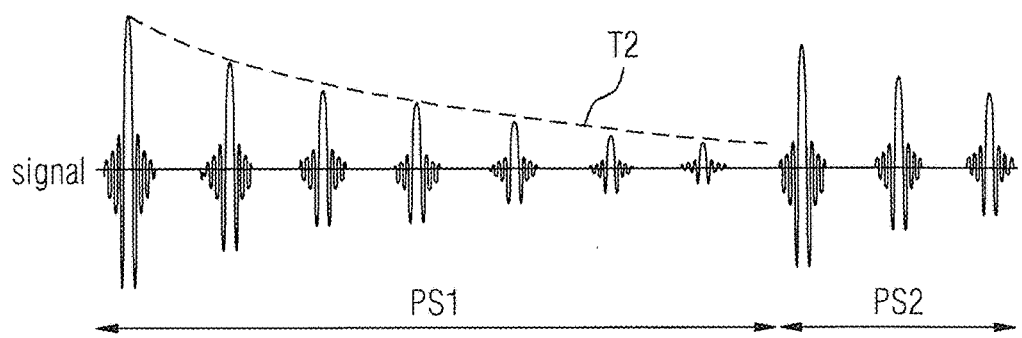
FIG. 5 shows a schematic representation of an acquisition of reference measurement data and original measurement data according to the invention.

This is also illustrated as an example in FIG. 5, which shows signal waveforms of an example of echo signals generated by means of steps 101 and 103. In the example shown, a series of spin echo signals are generated by the first pulse sequence PS1, the amplitudes of which decrease over time in accordance with the T2 decay. Directly after the acquisition of the last spin echo signal generated by the one RF excitation pulse of the first pulse sequence PS1, further echo signals that, in the example shown, are again spin echo signals, are generated by means of a second pulse sequence PS2 and measured as reference measurement data.

If, following a repetition of the first pulse sequence, i.e. after the acquisition of the echo signals generated following an RF excitation pulse RF1, a desired completeness of the original measurement dataset $D_m$ (which is, however, still incomplete according to the Nyquist condition), has not yet been reached, the acquisition of the original measurement data 101 and of the reference measurement data 103 can be repeated until the desired completeness has been reached. This can be determined, for example, by a query 105 and the method can be controlled accordingly. The desired completeness in this case reflects, e.g., the acceleration achieved through the use of the parallel acquisition technique.

Once the original measurement dataset $D_m$ has reached the desired completeness, the original measurement dataset $D_m$ is completed to produce a complete measurement dataset (D) with the use of the acquired reference measurement dataset $D_{ref}$ and a parallel acquisition technique (block 107).

The target volume Z of the examination subject U can be, e.g., a slice in the examination subject U. During the acquisition of the original measurement dataset $D_m$ for such a slice, the desired completeness can be achieved already after one RF excitation pulse RF1 of the first pulse sequence PS1, such that it is sufficient to perform steps 101 and 103 only once.

In an exemplary embodiment, the first pulse sequence PS1 is a TSE sequence. As explained, a number of spin echo signals can be generated and measured using a TSE sequence following an RF excitation pulse. In particular, the first pulse sequence PS1 can be a HASTE sequence.

In the case of TSE sequences, particularly in the case of HASTE sequences, the use of a parallel acquisition technique is advantageous because of the reduction in the (original) measurement data to be acquired and the shortening of the measurement time associated therewith. This is because the long echo trains made possible by TSE, i.e. the large number of successively generated spin echo signals following an excitation, the amplitudes of which, however, decrease in accordance with the T2 decay, result in the creation of an intrinsic k-space filter that reduces the spatial resolution and can lead to so-called blurring artifacts. These can be reduced or even avoided completely by an acceleration by parallel acquisition.

In this case the original measurement data acquired by the first pulse sequence PS1 is not affected by the inventive acquisition of the reference measurement dataset by the second pulse sequence PS2 directly after an acquisition of original measurement data by the first pulse sequence PS1. No saturation of the magnetization for the acquisition of the original measurement data takes place in the method according to the invention as a result of the acquisition of the reference measurement data. Accordingly, saturation artifacts, which manifest themselves as areas having reduced intensity, can be avoided by the method according to the invention.

Furthermore, the acquisition of the original measurement data itself is also not affected by the acquisition of the reference measurement data, as would be the case if the reference measurement data, which are sampled completely according to the Nyquist criterion, were to be acquired as well within the scope of the first pulse sequence PS1, or in an interleaved acquisition of reference measurement data and original measurement data. The method according to the invention has no (negative) impact on the echo time(s) of the original measurement data, in particular the echo times of the original measurement data lying in the center of k-space, or on the length of the echo train. Accordingly, the method according to the invention enables a reduction in or even an avoidance of blurring artifacts and comparatively short echo times.

Furthermore, because the acquisition of the reference measurement data on the one hand and of the original measurement data on the other hand are closely coupled in time, a high level of robustness of the method with regard to movements of the examination subject is achieved. This is of advantage in the case of so-called breath-hold measurements, in which a patient being examined is required to hold his or her breath as long as possible during the measurement in order to avoid the respiratory movements, for it often happens that patients cannot hold a breath for a sufficiently long time and consequently significant movements occur, particularly toward the end of the measurement. Even in this case, as a result of the inventive acquisition of the reference measurement data directly after the original measurement data, the effect of the motion on the quality of the completed measurement dataset is at most insignificant.

Furthermore, the first pulse sequence PS1 can be a TSE BLADE sequence. In this case, e.g. following an excitation by means of an RF excitation pulse RF1 of the first pulse sequence PS1, all echo signals of a so-called BLADE blade that are required for a desired completeness of the original measurement dataset $D_m$ can be measured, so that the acquisition of the original measurement data (block 101) and of the reference measurement data (block 103) is performed once per BLADE.

The second pulse sequence can be an SE sequence, a TSE sequence, a single-shot TSE sequence or a HASTE sequence. As already described, the TSE sequences in particular are well suited to the acquisition of reference measurement data by virtue of their rapid data acquisition. Furthermore, SE sequences are generally not sensitive to basic magnetic field inhomogeneities. Using one of the cited SE sequences as the second pulse sequence PS2 for the acquisition of the reference measurement data can therefore avoid so-called aliasing artifacts, which can be produced when the measurement data scan and the reference scan exhibit different sensitivities to basic magnetic field inhomogeneities, and as a consequence parts of the image data are distorted or eliminated.

The second pulse sequence PS2 for the acquisition of the reference measurement data can have a comparatively low resolution, in particular a lower resolution than the first pulse sequence PS1. The time period between a number of repetitions of the first pulse sequence 101.1 can be kept short as a result.

A particularly high quality of the completed measurement datasets D, and consequently of the MR images ultimately reconstructed from these, can be achieved by choosing the type of the second pulse sequence as the same type of pulse sequence as the first pulse sequence. Since e.g. GRE sequences are more susceptible to magnetic field effects, e.g. inhomogeneities of the basic magnetic field, than SE sequences, using a GRE sequence as the second pulse sequence for the acquisition of the reference measurement data and using an SE sequence as the first pulse sequence for the acquisition of the original measurement data can lead—particularly in the case of large FOVs and higher magnetic field strengths—to peripheral areas of the FOV no longer being able to be sufficiently well resolved, as a result of which aliasing artifacts are produced in the finally reconstructed MR images.

When, for example, a GRAPPA technique or a SENSE technique is used as the parallel acquisition technique, a possibly different contrast in the reference measurement data compared to the original measurement data does not affect the reconstruction of the completed measurement dataset.

In this case, the first pulse sequence PS1 for the acquisition of the original measurement data and the second pulse sequence PS2 for the acquisition of the reference measurement data can also have different parameterizations, in particular different bandwidths, e.g. in the excitation, or also other types of gradient switching, e.g. in order to reduce the overall acquisition duration.

FIG. 6 schematically illustrates a magnetic resonance apparatus according to the invention. This apparatus has an MR data acquisition scanner 1 with a basic magnet field 3 that generates the basic magnetic field, a gradient coil arrangement 5 that generates the gradient fields, a radio-frequency (RF) 7 that radiates and receives (detects) echo signals, and a control computer 9 programmed to perform the method according to the invention. These subsidiary units of the magnetic resonance apparatus are depicted only in schematic form in FIG. 6. The radio-frequency antenna 7 may be composed of a number of subunits, such as multiple coils, which are designed to receive the triggered echo signals and, if necessary, also to radiate radio-frequency signals (RF pulses).

In order to examine an examination subject U, for example a patient or a phantom, the latter is introduced on a platform L into the magnetic resonance scanner 1, into its measurement volume.

The control computer 9 serves for controlling the overall magnetic resonance apparatus and in particular the gradient coil arrangement 5 via a gradient controller 5' and the radio-frequency antenna 7 via a radio-frequency transmit/receive controller 7'. The radio-frequency antenna 7 has multiple channels in which signals can be transmitted or received.

The radio-frequency antenna 7 is responsible together with its radio-frequency transmit/receive controller 7' for generating and radiating (transmitting) an alternating radio-frequency field for manipulating certain nuclear spins in the examination subject U, in particular spins in at least one defined target volume Z, for example a slice, which can be excited in a targeted manner with the use a gradient field produced by activation of the gradient coil arrangement 5 by of the gradient controller 5' to generate.

In addition, the control computer 9 has a reconstruction processor 15, for controlling the acquisition and processing of the reference measurement data and the echo signals in order to perform the method according to the invention for the acquisition of magnetic resonance data by a parallel acquisition technique. A processor 13 incorporated in the control computer 9 is programmed to perform all of the computing operations that are necessary for the required measurements and determinations. Intermediate results and results required for this purpose or determined in the process can be stored in a memory S of the control computer 9. The depicted units are in this case not necessarily physically separate components, but merely represent a subdivision into representative components for explanatory purposes. These components may be realized as a smaller number of physical components or even as just one physical component.

Control commands can be directed, e.g. by a user, to the magnetic resonance apparatus via an input/output (I/O) interface of the magnetic resonance apparatus and/or results of the control computer 9 such as e.g. generated image data, can be displayed.

The method as described herein may also be implemented in the form of a non-transitory, computer-readable data storage medium 26 that is encoded with programming instructions. When the data storage medium 26 is loaded into a program memory of the control computer 9, the programming instructions cause the control computer 9 to implement the method as described herein when the instructions are executed by the control computer 9.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus having an MR data acquisition scanner, said method comprising:
   (a) with a control computer, operating the MR data acquisition scanner to execute a first pulse sequence while an examination subject is situated in the MR data acquisition scanner, including radiating a radio-frequency (RF) excitation pulse into a target volume of the examination subject;
   (b) with said control computer, operating the MR data acquisition scanner to acquire echo signals, produced in the target volume by the RF excitation pulse of the first pulse sequence, and storing the echo signals, as an original measurement dataset, in a memory accessible by said control computer;
   (c) with the control computer, operating the MR data acquisition scanner to acquire a reference measurement dataset by executing a second pulse sequence immediately after acquisition of said echo signals of the first pulse sequence;
   (d) repeating steps (a) through (c) until said original measurement dataset has reached a predetermined degree of completeness that is still incomplete according to the Nyquist criterion; and
   (e) in said control computer, completing the original measurement dataset, proceeding from said predetermined degree of completeness, by using the acquired reference measurement dataset and a parallel acquisition technique, in order to produce a complete measurement dataset, and making the complete measurement dataset available in electronic form from the control computer as a data file.

2. A method as claimed in claim 1 comprising executing said first pulse sequence as a TSE sequence.

3. A method as claimed in claim 1 comprising executing said first pulse sequence as a HASTE sequence.

4. A method as claimed in claim 1 wherein said target volume of said examination subject is a slice in the examination subject, and performing steps (a) through (c) only once.

5. A method as claimed in claim 1 comprising executing said first pulse sequence as a TSE BLADE sequence.

6. A method as claimed in claim 5 wherein said TSE BLADE sequence comprises acquiring echo signals from each of a plurality of blades, and performing steps (a) through (c) once per blade.

7. A method as claimed in claim 1 comprising executing said second pulse sequence as a sequence selected from the group consisting of an SE sequence, a TSE sequence, a single-shot TSE sequence and a HASTE sequence.

8. A magnetic resonance (MR) apparatus comprising:
   an MR data acquisition scanner;

a control computer configured to operate the MR data acquisition scanner to (a) execute a first pulse sequence while an examination subject is situated in the MR data acquisition scanner, including radiating a radio-frequency (RF) excitation pulse into a target volume of the examination subject;

said control computer being configured to operate the MR data acquisition scanner to (b) acquire echo signals, produced in the target volume by the RF excitation pulse of the first pulse sequence, and storing the echo signals, as an original measurement dataset, in a memory accessible by said control computer;

said control computer being configured to operate the MR data acquisition scanner to (c) acquire a reference measurement dataset by executing a second pulse sequence immediately after acquisition of said echo signals of the first pulse sequence;

said control computer being configured to repeat (a) through (c) until said original measurement dataset has reached a predetermined degree of completeness that is still incomplete according to the Nyquist criterion; and said control computer being configured to complete the original measurement dataset, proceeding from said predetermined degree of completeness, by using the acquired reference measurement dataset and a parallel acquisition technique, in order to produce a complete measurement dataset, and to make the complete measurement dataset available in electronic form from the control computer as a data file.

9. A non-transitory, computer-readable data storage medium encoded with programming instructions, said storage medium being loaded into a control computer of a magnetic resonance (MR) apparatus that comprises an MR data acquisition scanner, and said programming instructions causing said control computer to:

operate the MR data acquisition scanner to (a) execute a first pulse sequence while an examination subject is situated in the MR data acquisition scanner, including radiating a radio-frequency (RF) excitation pulse into a target volume of the examination subject;

operate the MR data acquisition scanner to (b) acquire echo signals, produced in the target volume by the RF excitation pulse of the first pulse sequence, and store the echo signals, as an original measurement dataset, in a memory;

operate the MR data acquisition scanner to (c) acquire a reference measurement dataset by executing a second pulse sequence immediately after acquisition of said echo signals of the first pulse sequence;

repeat (a) through (c) until said original measurement dataset has reached a predetermined degree of completeness that is still incomplete according to the Nyquist criterion; and complete the original measurement dataset, proceeding from said predetermined degree of completeness, by using the acquired reference measurement dataset and a parallel acquisition technique, in order to produce a complete measurement dataset, and make the complete measurement dataset available in electronic form from the control computer as a data file.

* * * * *